US007379861B2

United States Patent
Kfir et al.

(10) Patent No.: US 7,379,861 B2
(45) Date of Patent: May 27, 2008

(54) DYNAMIC PROGRAMMING OF TRIGGER CONDITIONS IN HARDWARE EMULATION SYSTEMS

(75) Inventors: Alon Kfir, San Jose, CA (US); Viktor Salitrennik, San Jose, CA (US)

(73) Assignee: Quickturn Design Systems, Inc., San Jose, CA (US)

( * ) Notice: Subject to any disclaimer, the term of this patent is extended or adjusted under 35 U.S.C. 154(b) by 394 days.

(21) Appl. No.: 11/133,819

(22) Filed: May 19, 2005

(65) Prior Publication Data

US 2005/0267730 A1    Dec. 1, 2005

Related U.S. Application Data

(60) Provisional application No. 60/575,492, filed on May 28, 2004.

(51) Int. Cl.
    *G06F 9/455*      (2006.01)
(52) U.S. Cl. ............... 703/28; 703/15; 703/24; 703/27; 703/22; 714/725; 717/128
(58) Field of Classification Search ............ 703/28, 703/24, 15, 27, 22; 714/725; 717/128; 326/40
See application file for complete search history.

(56) References Cited

U.S. PATENT DOCUMENTS

| 5,425,036 | A | 6/1995 | Liu et al. | |
|---|---|---|---|---|
| 5,841,967 | A | 11/1998 | Sample et al. | |
| 6,265,894 | B1 * | 7/2001 | Reblewski et al. | 326/39 |
| 6,321,186 | B1 * | 11/2001 | Yuan et al. | 703/15 |
| 6,388,465 | B1 | 5/2002 | Barbier et al. | |
| 6,647,362 | B1 | 11/2003 | Reblewski et al. | |
| 6,694,464 | B1 * | 2/2004 | Quayle et al. | 714/725 |
| 2004/0102953 | A1 * | 5/2004 | Agarwala et al. | 703/24 |
| 2004/0102954 | A1 * | 5/2004 | Agarwala et al. | 703/28 |
| 2004/0103398 | A1 * | 5/2004 | Agarwala et al. | 717/128 |
| 2004/0111248 | A1 * | 6/2004 | Granny et al. | 703/22 |
| 2004/0148153 | A1 * | 7/2004 | Beletsky et al. | 703/27 |
| 2004/0178820 | A1 * | 9/2004 | Barbier et al. | 326/40 |
| 2004/0215442 | A1 * | 10/2004 | Musselman | 703/24 |

FOREIGN PATENT DOCUMENTS

EP      1 376 417 A1      1/2004

OTHER PUBLICATIONS

European Search Report, Issued Jul. 17, 2005.

* cited by examiner

*Primary Examiner*—Paul Rodriguez
*Assistant Examiner*—Kandasamy Thangavelu
(74) *Attorney, Agent, or Firm*—Orrick, Herrington & Sutcliffe LLP

(57) ABSTRACT

An improved emulation system having an improved trigger mechanism is disclosed. During the compilation of the circuit design, a portion of the emulation resources are reserved for dynamic netlists. The dynamic netlists allows a user to create arbitrary trigger circuits that can be based on any signal generated by the device under test during run time, including signals that were optimized out of the design during the compilation process. The dynamic netlists can be loaded and used in the emulator without having to recompile the entire design, which could take many hours. This enables a user to quickly and efficiently debug circuit designs.

25 Claims, 5 Drawing Sheets

DYNAMIC PROGRAMMING OF TRIGGER CONDITIONS IN HARDWARE EMULATION SYSTEMS

CROSS-REFERENCE TO RELATED APPLICATIONS

This application claims priority to U.S. Provisional Application Ser. No. 60/575,492 filed on May 28, 2004. Priority to this provisional application is expressly claimed, and the disclosure of this provisional application is hereby incorporated by reference in its entirety.

FIELD

The present disclosure relates generally to emulation systems and more particularly to trigger mechanisms used within emulation systems.

BACKGROUND

Emulation systems are used to verify electronic circuit designs prior to fabrication as chips or manufacture as electronic systems. Typical emulation systems utilize either interconnected programmable logic chips or interconnected processor chips. Examples of hardware logic emulation systems using programmable logic devices can be seen in, for example, U.S. Pat. Nos. 5,109,353, 5,036,473, 5,475,830 and 5,960,191. U.S. Pat. Nos. 5,109,353, 5,036,473, 5,475,830 and 5,960,191 are incorporated herein by reference. Examples of hardware logic emulation systems using processor chips can be seen in, for example, U.S. Pat. Nos. 5,551,013, 6,035,117 and 6,051,030. U.S. Pat. Nos. 5,551,013, 6,035,117 and 6,051,030 are incorporated herein by reference.

Emulation systems generally include a host computer (also referred to as a workstation) in communication with an emulator. The emulator can be arranged to communicate with a target system. The target system typically includes multiple electronic devices such as memory, microprocessors, application specific integrated circuits (ASICs), field programmable gate arrays (FPGAs), etc. that communicate with one another to perform specific functions. The components in the target systems are typically electronic devices that have already been developed. An example of a target system would be a computer motherboard having all ancillary chips located thereon. Using an emulator, one can verify that a chip such as a microprocessor operates as intended in the computer.

The emulator can also be used without a target system by running test vectors or a test bench. A test bench provides stimulus to the emulator's inputs and monitors and checks the emulator's outputs. A test bench can be embedded in the emulator itself or can be a software program running on another computer (typically another workstation).

The emulator mimics the functionality of a system that is being developed, which is referred to herein as a "device under test" (DUT). A device under test can be any system that includes logic that needs to be verified such as a single integrated chip, a printed circuit board with many chips, or multiple printed circuit boards each having multiple chips.

The process of designing an integrated circuit includes several phases. First, a designer creates a design (which will be the DUT) using specialized design software that runs on a host computer. Second, the design is compiled using specialized software that also runs on the host computer. The compilation process translates the DUT into a format that can be utilized by the emulator. This compilation process is very time consuming, often taking on the order of several hours to complete. Third, the user loads the compiled DUT into the emulator via the host computer. Fourth, the user emulates the DUT by running the emulator.

Unfortunately, DUTs usually have flaws or bugs that need to be fixed before they can be implemented in an actual device. Trigger circuits help the designer isolate and fix these problems. Specifically, trigger circuits allow the designer to define a trigger condition, which is based on an event or series of events that occur during emulation of the design. When the trigger condition is met, an action is taken. For example, upon detection of the trigger condition, a data collection mechanism called a trace buffer, which continuously collects and stores signal values from the emulated design, is instructed to stop, or the design running in the emulator may be stopped.

Trigger circuits can be simple or complex. A simple trigger circuit can evaluate the values of a predetermined set of signals in the design. For example, if A, B, and C are signals in the design, a trigger could be defined simply as follows: A=0 & B=1 & C=0. In this case, when the values of these three signals match their expected values of 0, 1, and 0, respectively, the trigger circuit would produce a signal indicating that the trigger condition has been met. A simple comparator circuit could be used to produce this trigger signal. Triggers can also be based on more complex combinations of signals within the design. Using a more complex trigger circuit, a different set of conditions can be tested each cycle, and based on the result the system decides whether to issue a trigger signal or not and what set of conditions to test in the next cycle. A state machine could be used in the trigger circuit in this case. Regardless of the flexibility or complexity of the trigger circuit, the trigger condition is based on signal values that are accessible from within the emulator. Such signal values may be any signal that is accessible inside the emulator, whether generated within the design under test, a test bench embedded inside the emulator or input from an external test bench or a target system.

Conventional trigger circuits suffer from several shortcomings. First, the topology of these circuits cannot be changed after the design is compiled for programming inside the emulator. For example, a user will have to define a set of signals that can participate in a trigger condition during the design phase. At the completion of the design phase, the DUT and the user defined trigger circuit are compiled into a format that can run on an emulator. If the user wants to use a different set of signals for the trigger condition during run time, the user will have to recompile the entire DUT with the new trigger circuit, which can take several hours or even days, depending upon the size and style of the design and the emulator technology. Even if run time routing of arbitrary signals to the trigger circuit was possible, if the desired signal is eliminated by the compiler as a result of an optimization stage, then the entire design would have to be recompiled to ensure that the signal is not optimized out, which again would take several hours or days. "Optimized out" means that the signal is not directly emulated because it was eliminated during design compilation as part of an optimization step. This happens because the compiler must take the user's logic and optimize it for use in the emulator in order to save emulation resources. Thus, the compiler may replace the user's logic with functionally equivalent logic.

Second, even though conventional trigger circuits can have some programmability, the complexity of the conditions that can be defined as triggers during run time is very limited. This is because the topology of the trigger circuit cannot be changed after the design is compiled. Simple trigger circuits are limited to the definition of a comparison between the set of specified signals and their expected values. In more advanced trigger circuits, a more sophisticated structure, such as a lookup table, is used to combine results from several such comparison circuits. But in either case, it is nearly impossible to define an arbitrary Boolean condition from the given set of signals that can be used as a trigger condition.

In view of the foregoing, a need exists for an emulation system having an improved trigger mechanism.

SUMMARY

An emulation system having an improved trigger mechanism is disclosed. The trigger mechanism described herein can be dynamically changed during run time, thereby eliminating the need to recompile the design should the user need to define a new trigger condition. Additionally, any signal in the design, whether optimized out or not, can be used during run time to define the new trigger condition. Other aspects and features will become apparent from consideration of the following description taken in conjunction with the accompanying drawings.

Figure 1:
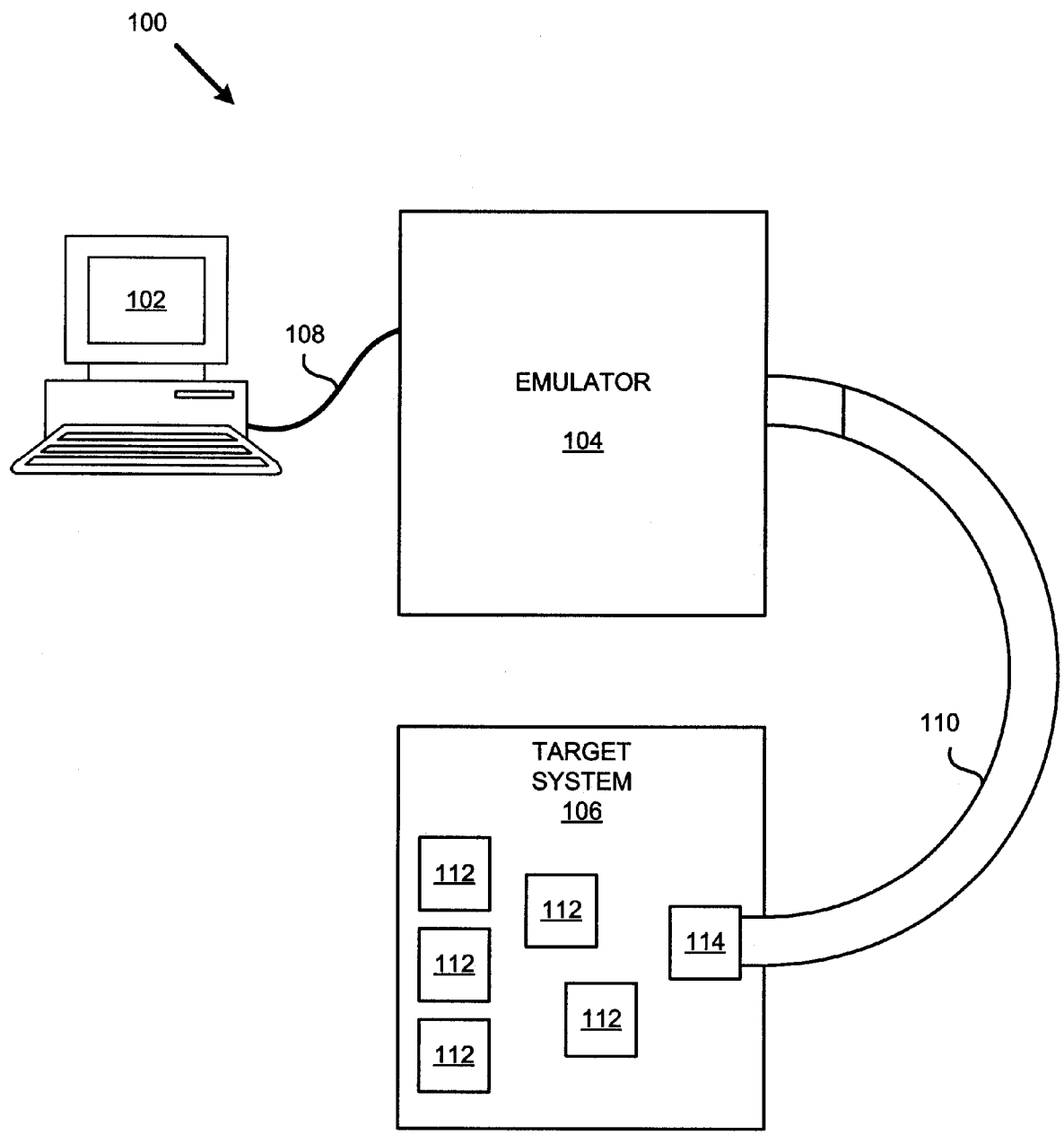
FIG. 1 is a block diagram of an exemplary emulation system that can be used with embodiments described herein.

It should be noted that the figures are not drawn to scale and that elements of similar structures or functions are generally represented by like reference numerals for illustrative purposes throughout the figures. It also should be noted that the figures are only intended to facilitate the description of the preferred embodiments. The figures do not describe every aspect of the present invention and do not limit the scope of the invention.

DETAILED DESCRIPTION OF THE DRAWINGS

Turning to the figures, exemplary embodiments will now be described.

FIG. 1 is a block diagram of an exemplary emulation system 100 that can be used with embodiments described herein. Emulation system 100 includes a host computer 102 (also referred to as a workstation), an emulator 104, and a target system 106. Emulation system 100 allows a design to be tested in an intended target system 106 before the design is actually implemented in a device or system. Host computer 102 can be any type of computer that is capable of communicating with emulator 104. Emulator 104, as described in detail below, emulates the functionality of a design and allows a user to observe how the design operates in target system 106. Target system 106 typically includes multiple devices 112 such as memory, microprocessors, application specific integrated circuits (ASIC), field programmable gate arrays (FPGAs), etc.

Host computer 102 and emulator 104 communicate with one another via communication link 108. Emulator 104 and target system 106 communicate with one another via another communication link 110. As used herein, a communication link is any type of link that allows data to be transferred from one place to another, such as electrical, optical, or wireless communication links. Target system 106 includes inputs/outputs 114, which correspond to the inputs and outputs of the device being emulated and is in electrical communication with communication link 110. Emulator 104 can also be run in a standalone mode where test vectors are input as the stimulus for the design under test or using a test bench as explained above.

To emulate a design, a user first creates a design using specialized software. The user's design is sometimes referred to as a "design under test" (DUT) or a "design under verification" (DUV). The design software operates on host computer 102 or another computer. When the user compiles the design, the design is translated into a data format that is compatible with emulator 104. A computer program running on host computer 102 or another computer performs the compilation process. Next, the compiled design is loaded into emulator 104 via host computer 102. Emulator 104, which emulates the design, can be connected to target system 106 and run in the intended environment to determine whether the design operates properly in target system 106. When connected to a target system 106, the inputs and outputs of the design are transmitted through inputs/outputs 114 in target system 106 via communication link 110. The emulator can also run the DUT using test benches or test vectors.

Figure 2:
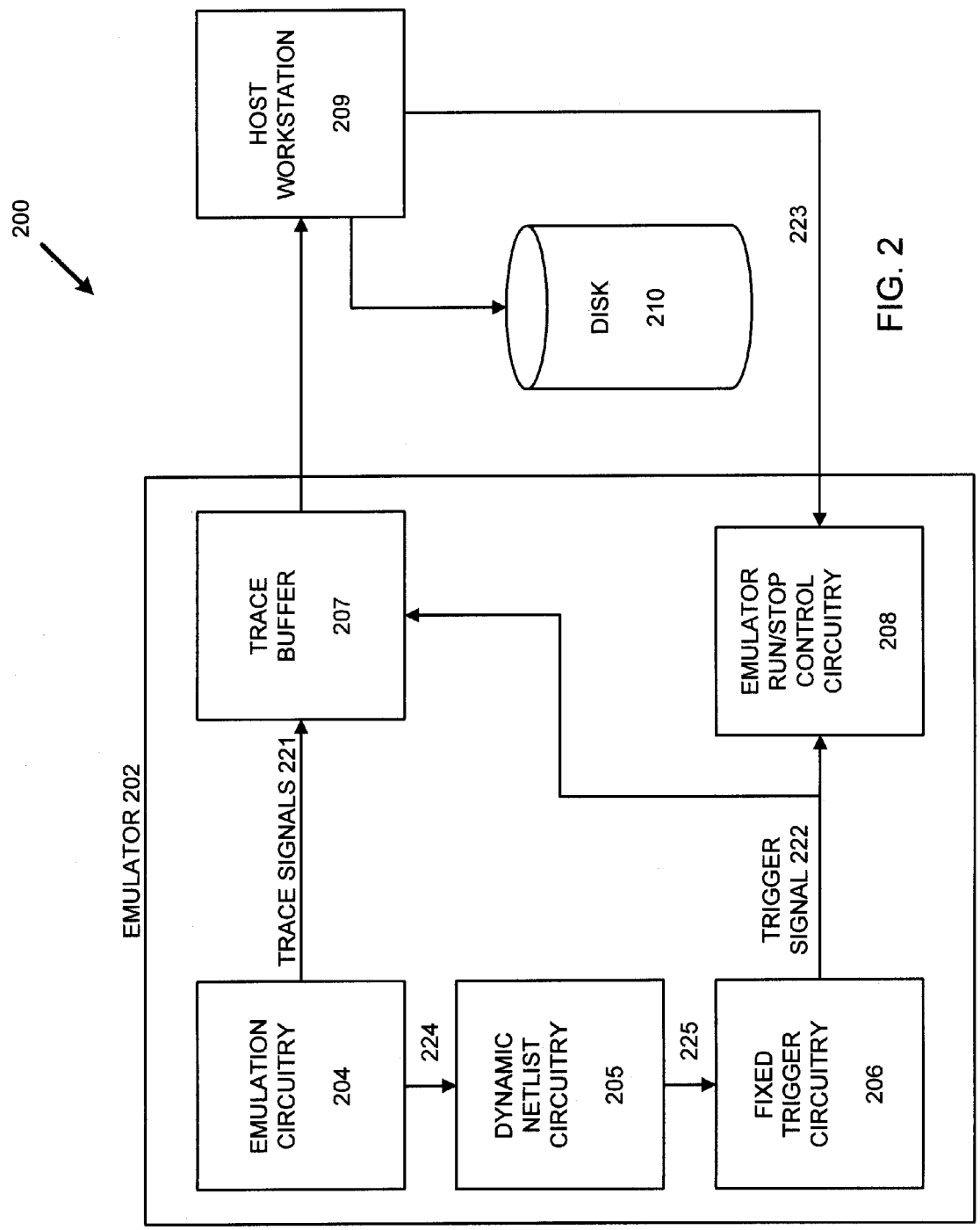
FIG. 2 is a block diagram of an exemplary emulation system showing an emulator in detail that can be used with embodiments described herein.

FIG. 2 is a detailed block diagram of an exemplary emulation system 200 that can be used with embodiments described herein. Emulation system 200 includes an emulator 202 and a host computer 209. Emulator 202 can serve as emulator 104 in emulation system 100 of FIG. 1. Emulator 202 includes an emulation circuitry 204, dynamic netlist circuitry 205, fixed trigger circuitry 206, trace buffer 207, and emulator run/stop control circuitry 208. Although emulator 202 includes trace buffer 207, it should be recognized that trace buffer 207 may be external to the emulator and some systems may not include trace buffer 207.

Emulation circuitry 204 represents the circuitry within emulator 202 that is used to emulate the device under test. In addition to the device under test, emulation circuitry 204 may also be used to implement a test bench (if the test bench was compiled and loaded into the emulator) and any other instrumentation circuitry that might be added during design compilation to aid the run time system. Selected signals 221 from the emulated circuit 204 are stored in trace buffer 207 during the emulation. Selected signals 221 may be outputs from processors in processor based emulation systems or output from configurable logic blocks in programmable logic based emulation systems. Trace buffer 207 is typically a random access memory (RAM) configured as a circular buffer. Those of ordinary skill in the art will recognize that other suitable circuitry such as a sequential access memory can be used to implement trace buffer 207.

Dynamic netlist circuitry 205 represents the circuitry within emulator 202 that is used for dynamic netlists. A dynamic netlist can represent any type of logic or memory elements, such as combinational gates and state devices (e.g., registers) and is used to define a trigger condition. Dynamic netlists can be loaded into the emulator and used to generate trigger signals during run time. Run time refers to the time when the design is loaded into the emulator and the user can interact with the emulator whether the design is presently being emulated or not. Dynamic netlist circuitry 205 receives selected signals 224 from emulation circuitry 204. Selected signals 224 are signals that are used in the definition of a trigger condition.

The outputs 225 of the dynamic netlists in dynamic netlist circuitry 205 are provided to fixed trigger circuitry 206. Fixed trigger circuitry 206 represents the circuitry within emulator 202 that is used in conjunction with dynamic netlist circuitry 205 to generate trigger signal 222. Fixed trigger circuitry 206 typically has a fixed topology (i.e., it cannot be modified during the emulation session), although it may include lookup tables inside it that can be re-programmed during the emulation session. Fixed trigger circuitry 206 may be implemented using emulation resources or it can be a separate piece of hardware that is hardwired.

Dynamic netlist circuitry 205 and fixed trigger circuitry 206 together form a dynamic trigger mechanism. The topology of the circuitry represented by dynamic netlist circuitry 205 is dynamic (i.e., it can be modified during run time), while the topology of the circuitry represented by fixed trigger circuitry 206 is typically, but not necessarily fixed (i.e., it cannot be modified during run time.) For ease of explanation, the following description assumes that the topology of fixed trigger circuitry 206 is fixed.

Fixed trigger circuitry 206 generates trigger signal 222 when a certain user defined trigger condition has been met. Trigger signal 222 can be used to freeze trace buffer 207 (so the data that was captured up to that point is not overwritten), and/or cause the emulator run/stop control circuitry 208 to stop the emulator. When trigger signal 222 is used to freeze trace buffer 207, trigger signal 222 typically does not stop tracing immediately, but only after an amount of delay that is programmed by the user. The amount of delay can be many thousands of cycles. This is done so the user can see trace data that shows what happened both before and after the trigger condition has been met.

After the trigger signal 222 occurs, host computer 209 is notified that the trigger condition has occurred. In response, host computer 209 can either load the contents of trace buffer 207 into disk 210 and/or it can request to resume the emulation by sending a request to emulator run/stop control circuitry 208.

A user typically specifies a trigger definition on the host computer via a user friendly description such as a text file or a graphical user interface. The trigger definition is then compiled by the host computer into a downloadable image. Part of this image is loaded into lookup tables in the fixed trigger circuitry 206, and part of it is a set of compiled dynamic netlists images which are programmed into the dynamic netlist circuitry 205. The user then runs the emulator until the trigger definition is met and a trigger signal is generated. If the user changes the trigger definition in such a way that some of the dynamic netlists that are currently loaded in the dynamic netlists 206 portion of emulation resources 202 are not needed any more, then those dynamic netlists can be eliminated and their resources freed. Other dynamic netlists can be created, constructed, and loaded into dynamic netlist circuitry 205 portion of emulation resources 202 during run time as needed by the user.

There are two types of dynamic netlists, each of which serves a unique purpose. The first type is used to reconstruct signals that were optimized out during the compilation of the design. Reconstruction of these signals allows them to be used to define a trigger condition during run time. The second type is used to evaluate arbitrary Boolean expressions that are defined by the user during run time. The user can define a trigger condition during run time using a set of Boolean expressions based on signals or a sequence of conditions based on such Boolean expressions that occur in the device under test or other signals present in the emulated design. Thus, specification of the Boolean expressions or changing the set of signals used in the Boolean expressions can be done at any time during run time without the need to recompile the design, even if the user requests to use signals that were optimized out during design compilation. Both types of dynamic netlists are discussed in greater detail below.

Figure 3A:
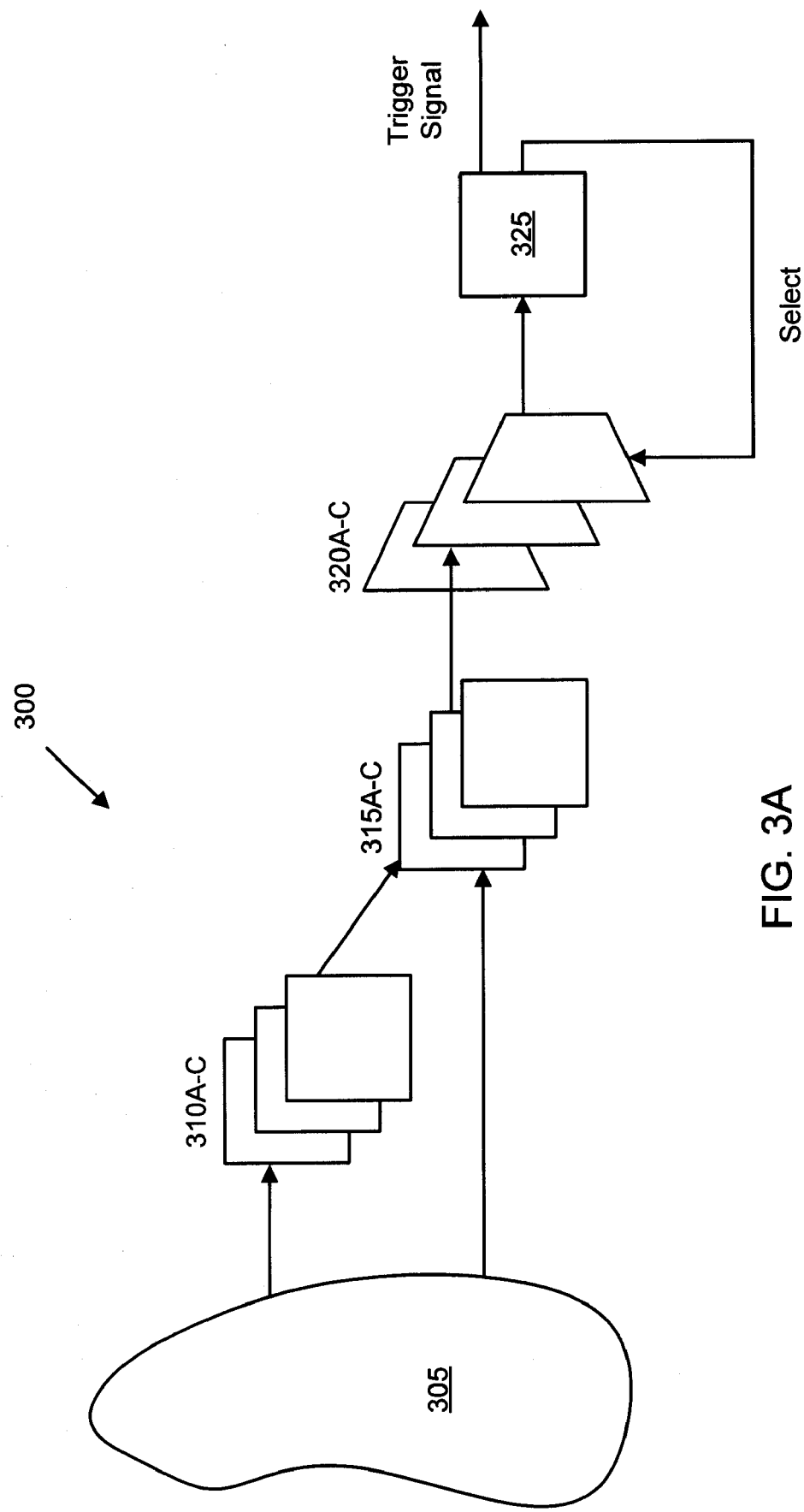
FIG. 3A is a conceptual diagram of an exemplary emulator including an emulated design and a triggering mechanism. The triggering mechanism shown in FIG. 3A includes two types of dynamic netlists: dynamic netlists that are used to reconstruct signal values that were eliminated when the design was being compiled and dynamic netlists that are used to evaluate arbitrary Boolean expressions specified by the user as part of the trigger definition.

FIG. 3A is a conceptual diagram of an exemplary emulator 300 including an emulated design and triggering circuitry that can be used with embodiments described herein. FIG. 3A includes a design under test 305, a first set of dynamic netlists 310A-C, a second set of dynamic netlists 315A-C, selection circuits 320A-C, and a decision circuit 325. Although the triggering circuitry described in FIG. 3A is relatively advanced circuitry that can change the trigger criteria along time (i.e. use a different set of Boolean expressions and signals each new clock cycle), it should be recognized that simpler triggering circuitry can be constructed and is within the scope of the claims.

Design under test 305 is a circuit design that has been compiled and loaded onto an emulator such as emulator 202 (FIG. 2). During the compilation of design under test 305, a small amount of emulation resources are reserved so that one or more dynamic netlists can be loaded into the emulator during run time. In one embodiment, 1 out of every 64 processors in emulator 200 or approximately 1.5% of the emulation resources can be reserved for the dynamic netlists. Those of ordinary skill in the art will recognize that lesser or greater amounts of emulation resources can be reserved depending on the requirements of a particular application.

Dynamic netlists 310A-C are a set of netlists used to reconstruct the values of signals that were optimized out during design compilation, but that are needed for the trigger definitions created by a user during run time. As is known, Boolean logic can often be simplified. This simplification process may eliminate signals within the Boolean logic. For example, a Boolean circuit may include tens or hundreds of gates including an AND gate with two inputs (X and Y) and an output signal (A). Due to the nature of the circuit, the AND gate (and therefore signal A) may be eliminated without effecting the operation of the circuit as a whole. However, when creating a dynamic netlist 315, a user may need to use signal A for a trigger condition. Because signal A does not physically exist in the emulator, a dynamic netlist 310 is used to reconstruct signal A such that it physically exists in the emulator. This allows a user to use signal A in a dynamic netlist 315A-C. Dynamic netlists 310A-C can be created and eliminated as needed each time the user decides to change the trigger definition during run time.

The following algorithm illustrates one technique for creating a dynamic netlist 310. This recursive algorithm is based on traversal of a database that contains the original design topology of the design before any optimization steps. The steps of the algorithm are as follows.

Step 1: During compilation of the design, the compiler creates a database that contains connectivity information of the design under test before any optimization steps. This step is done once during design compilation. The connectivity database can then be used during run time.

Step 2: During run time, the user requests to use as part of the trigger definition a signal that was optimized out.

Step 3: The controlling software locates the driver of the signal (e.g., a logic gate) in the connectivity database that was created during step 1. The driver of the signal is then added to the topology of the dynamic netlist 310.

Step 4: Each of the input signals of the logic gate in step 3 above is tested as described in steps 5, 6 and 7 below.

Step 5: If the signal was already visited by the algorithm and added to the topology of the dynamic netlist being built in a previous recursion step, then the algorithm is pruned (the recursion is terminated) for that signal, because it means that the driver of that signal has already been added to the topology of the dynamic netlist 310 in a previous iteration.

Step 6: If the signal was not optimized out, which means it physically exists in the emulator, then the algorithm is pruned at that point because the dynamic netlist can connect directly to that signal in the emulated circuit.

Step 7: If the signal was optimized out, then the algorithm continues recursively with that signal from step 3 above.

This algorithm can be illustrated using the previous example of the AND gate with input signals X and Y and output signal A. Step 1: During the compilation of the design, the compiler creates a database that contains connectivity information before any optimization steps. This database includes the AND gate, the inputs to the AND gate (signals X and Y), and the output of AND gate (signal A). Step 2: The user requests to use as part of the trigger definition signal A. Because we have assumed that signal A was optimized out during the compilation process for this example, the algorithm continues to step 3. Step 3: The software running on the host computer searches the connectivity database and locates the driver of signal A, which is the AND gate. The software then adds the AND gate to the topology of a dynamic netlist 310. Step 4: Each of the input signals of the AND gate are tested as described in steps 5, 6 and 7 below. For this example, assume that signal X physically exists in the emulator, but that signal Y was optimized out and is output by an OR gate with inputs S and T, both of which physically exist in the emulator. Step 5: This step is not performed because neither signal X nor signal Y was previously visited by the algorithm in a previous recursion step. Step 6: The algorithm is pruned with respect to signal X since this signal physically exists in the emulator. Step 7: With respect to signal Y, the algorithm continues recursively with this signal from step 3 above until the dynamic netlist 310 includes the OR gate with inputs S and T.

Referring back to FIG. 3A, dynamic netlists 315A-C are a set of netlists that each evaluate one arbitrary Boolean expression. Dynamic netlists 315A-C are created and eliminated as needed each time the user decides to change the trigger definition. Dynamic netlists 315 allow a user to create arbitrary "if" statements based on any signal generated in the emulator. For example, suppose an emulator generates signals A, B, C, and D. In this case, dynamic netlists 315A-C could be defined as follows:

Dynamic netlist 315A: if (A==1 & C==0)
Dynamic netlist 315B: if (A==1 & B==1 & C==1 & D==1)
Dynamic netlist 315C: if (B==0|D==0)

In this case, if signal A is equal to 1 and signal C is equal to 0, the circuitry associated with dynamic netlist 315A will produce a true signal, if signal A is equal to 1 and signal B is equal to 1 and signal C is equal to 1 and signal D is equal to 1, the circuitry associated with dynamic netlist 315B will produce a true signal, and if signal B is equal to 0 or signal D is equal to 0, the circuitry associated with dynamic netlist 315C will produce a true signal. In other words, when the condition or event defined by a dynamic netlist is met, the dynamic netlist will output a true signal to selection circuits 320A-C.

Selection circuits 320 selects which set of outputs from dynamic netlists 315A-C will be used in the current clock cycle. Selection circuit 320 is optional and needed only in systems where the trigger mechanism allows the user to define a different set of trigger conditions each clock cycle. Selection circuit 320 can include multiple multiplexers or any other suitable circuits.

Decision circuit 325 decides when to issue a trigger signal, and also controls selection circuits 320 by deciding which outputs from dynamic netlists 315 should be selected in the next cycle. The trigger signal generated by decision circuit 325 typically stops the clocks and/or the trace data collection in the trace buffer within an emulator. The trace data can then be transferred to the host computer and observed by a user. Decision circuit 325 can be as simple as a single wire (when the trigger is based on a single Boolean expression), or as complex as a state machine with programming resources such as registers and counters. It can either have a fixed topology with programming capabilities through registers and lookup tables, or it can be constructed entirely out of a dynamic netlist resources or a set of interconnected dynamic netlists.

Figure 3B:
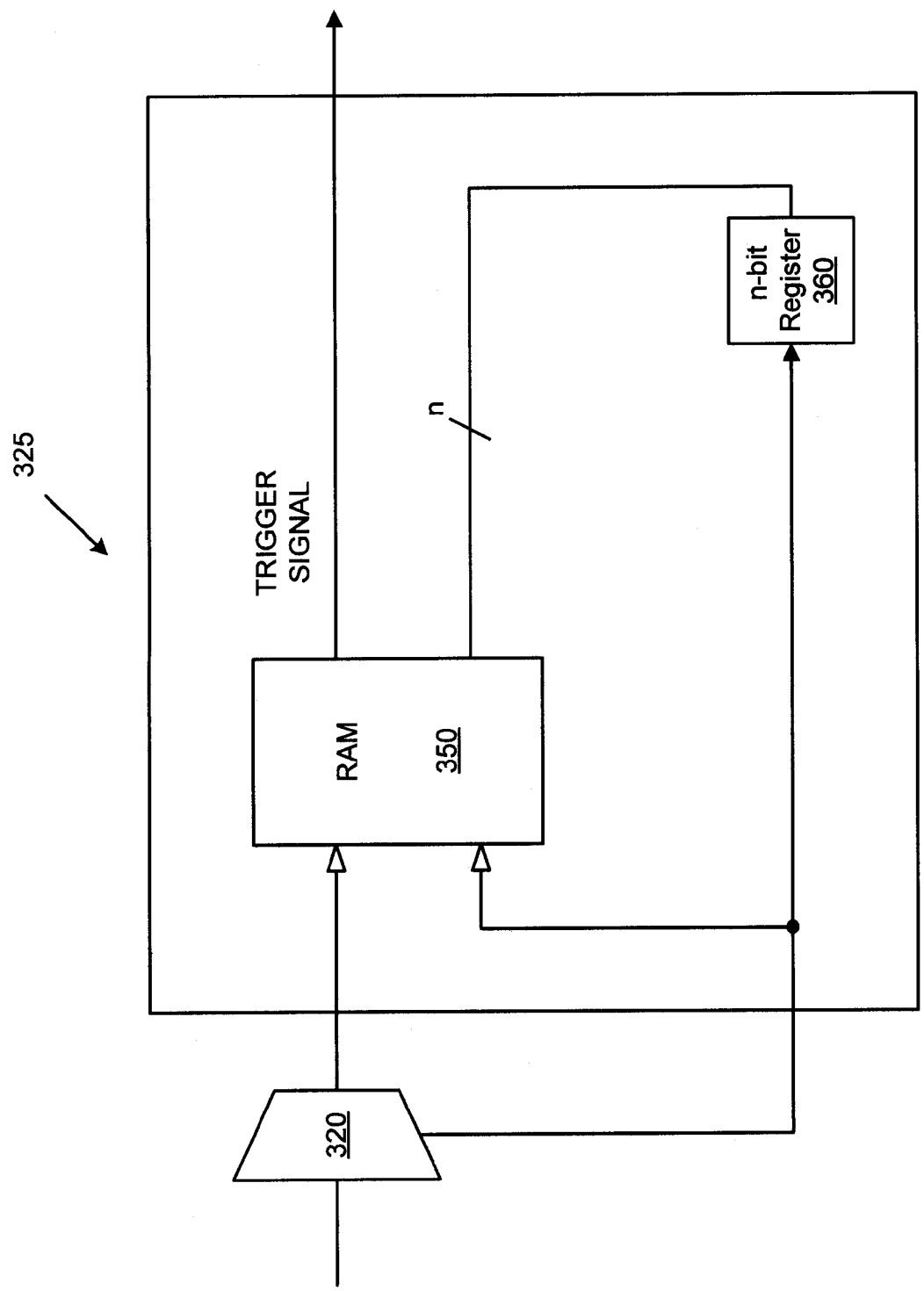
FIG. 3B is a detailed block diagram of the decision circuit shown in FIG. 3A.

FIG. 3B is a detailed block diagram of decision circuit 325 of FIG. 3A. Decision circuit 325, which is a state machine, includes a random access memory (RAM) 350 and a n-bit register 360. The outputs of selection circuit 320 are used as one set of inputs to RAM 350. The outputs of n-bit register 360 are used as another set of inputs to RAM 350. In operation, RAM 350 acts as a Look-Up Table (LUT) whose contents are addressed by the outputs of selection circuit 320 in combination with the outputs of n-bit register 360. One set of outputs from RAM 350 represent the next state and are provided to n-bit register 360. Another output of RAM 350 is the trigger signal. The outputs of n-bit register 360 represent the present state and are used to select a set of inputs to selection circuit 320 and as inputs to RAM 350.

Figure 4:
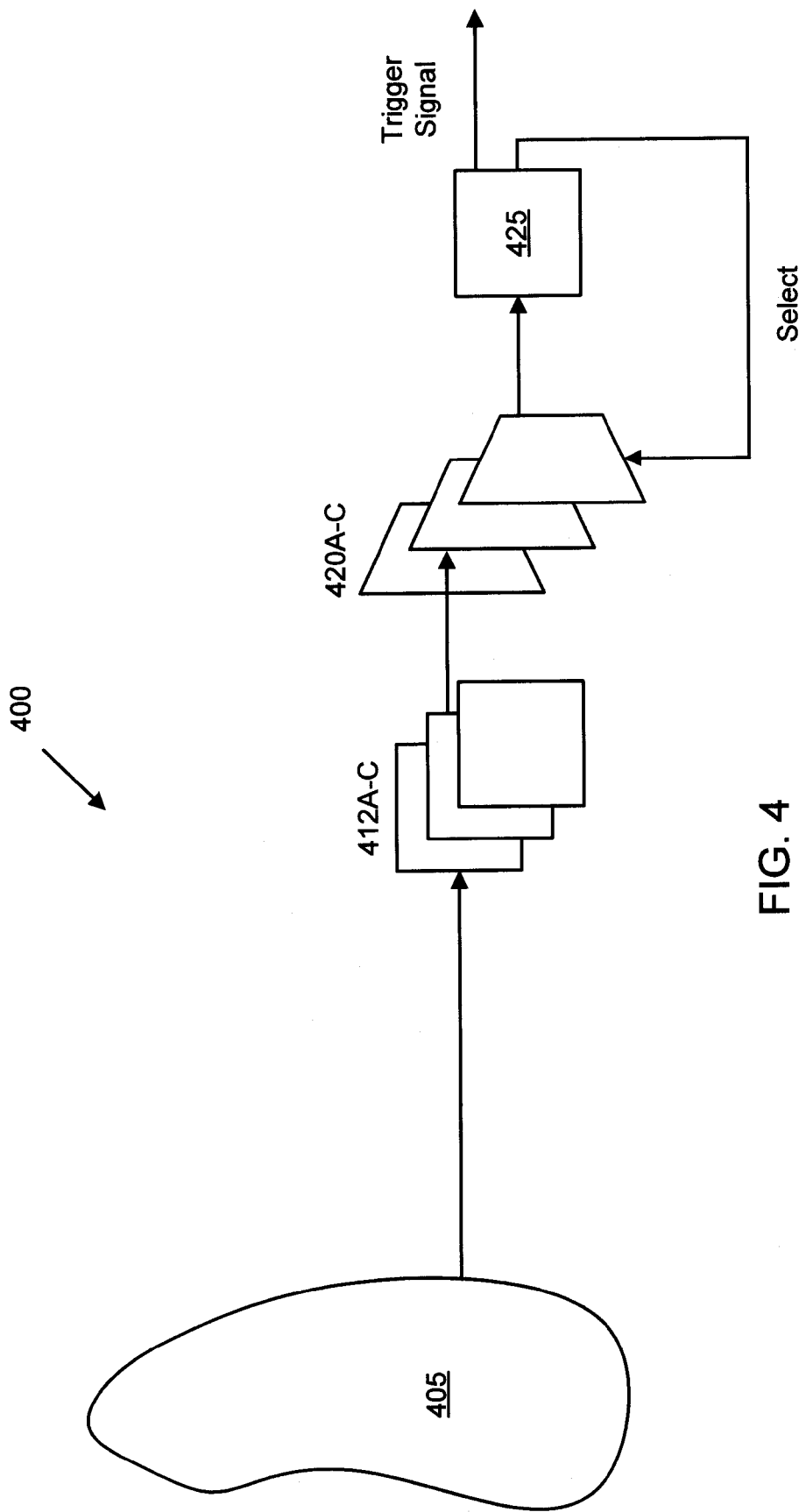
FIG. 4 is a conceptual diagram of the exemplary emulator of FIG. 3A after an optimization step has been performed on two types of dynamic netlists.

FIG. 4 shows the system of FIG. 3A after an optimization step has been performed on dynamic netlists 310A-C and 315A-C, and includes a design under test 405, a set of combined dynamic netlists 412A-C, selection circuits 420A-C, and a decision circuit 425. The optimization step combines portions of dynamic netlists 310 and 315. Specifically, before loading dynamic netlists 310 and 315 into the emulator, logic optimization techniques are used to combine the topologies of dynamic netlists 310 and 315 thereby creating a new set of dynamic netlists that have improved properties such as lower gate capacity and lower signal delay time. A computer program running on a host computer can perform the optimization.

There are many advantages associated with the dynamic netlists described herein. First, a user need not specify the set of signals that might be used for trigger definition prior to compilation of a design. Any signal in the design, whether optimized out during design compilation or not, can be used during run time in the trigger definition. Since design compilation is a slow process that can consume much time, the ability to define and redefine during run time any signal in a trigger definition, and get a response within seconds is a very important productivity issue. Second, the user can specify complex Boolean expressions as part of the trigger definition with very little limitation on the complexity of the expressions, except for practical limits imposed by the amount of available emulation resources that are reserved for creating the dynamic netlists. Conventional trigger circuits that were based on fixed structures limited the expressions that the trigger could use to either a simple comparison operation, or a set of a limited number of such comparisons.

Those of skill in the art will recognize that the various embodiments disclosed herein are susceptible to various modifications and alternative forms, and specific examples thereof have been shown by way of example in the drawings and are herein described in detail. For example, those of ordinary skill in the art will recognize that the embodiments disclosed herein can apply to programmable logic chip (e.g., field programmable gate array, or FPGA) based emulation systems as well as processor-based emulation systems. In both cases, the compiler reserves a predetermined amount of resources during compilation of the design for the dynamic netlists that can be created and loaded into the programmable logic chips or processors during run time. It should be understood, however, that the various embodiments disclosed herein are not to be limited to the particular forms or methods disclosed, but to the contrary, the invention is to cover all modifications, equivalents, and alternatives falling within the spirit and scope of the claims. Furthermore, it should be understood that the methods and algorithms described herein can be stored on a computer-readable storage medium such as a non-volatile or volatile computer memory, including flash memory, random access memory, magnetic memory, optical memory, or a CD-ROM.

What is claimed is:

1. An emulator system having emulation resources for emulating a circuit design, the emulation resources comprising:
    a first portion designed to emulate a compiled circuit design; and
    a second portion designed with one or more dynamic netlists for evaluating a Boolean expression specified by a user as part of a trigger definition,
    wherein the one or more dynamic netlists are loaded into the emulation resources of the emulator system and executed to generate a trigger signal without recompiling the compiled circuit design.

2. The emulator system of claim 1 wherein the emulation resources include a plurality of emulation processors.

3. The emulator system of claim 1 further comprising a trace buffer in electrical communication with the emulation resources, the trace buffer being used for storing data generated by the first portion of emulation resources.

4. The emulator system of claim 1 wherein the compiled circuit design is loaded into the emulator system via a host computer.

5. The emulator system of claim 1 wherein the one or more dynamic netlists are loaded into the emulator system via a host computer.

6. The emulator system of claim 1 wherein a user creates the one or more dynamic netlists using a computer program running on a host computer.

7. The emulator system of claim 1 wherein the trigger signal causes stopping storing of data in a trace buffer and loading the data captured up to that time into a host computer.

8. The emulator system of claim 1 wherein the trigger signal causes the emulator system to stop emulating the circuit design.

9. The emulator system of claim 1 wherein one or more of the dynamic netlists are used to form a programmable trigger circuit, the trigger circuit being a state machine comprising a random access memory and an N-bit register.

10. The emulator system of claim 9, wherein the programmable trigger circuit selects a dynamic netlist from the one or more of the dynamic netlists using the present state of the state machine.

11. The emulator system of claim 9, wherein the random access memory includes a look-up table.

12. An emulator system having emulation resources for emulating a circuit design, the emulation resources comprising:
    a first portion designed to emulate a compiled circuit design; and
    a second portion designed with one or more dynamic netlists for reconstructing a signal value within the circuit design that was eliminated when the design was being compiled,
    wherein the one or more dynamic netlists are loaded into the emulation resources of the emulator system and executed to generate a trigger signal without recompiling the compiled circuit design.

13. A method for dynamically programming a trigger condition into an emulator system having emulation resources for emulating a circuit design, the method comprising:
    loading a compiled circuit design into a first portion of the emulation resources of the emulator system from a host computer;
    loading data of one or more dynamic netlists representative of a trigger circuit into a second portion of emulation resources of the emulator system from the host computer;
    programming the data of the one or more dynamic netlists representative of the trigger circuit into the second portion of emulation resources of the emulator system; and
    evaluating a Boolean expression specified by a user as part of the trigger condition using the one or more dynamic netlists.

14. The method of claim 13 further comprising:
    compiling the circuit design to generate the compiled circuit design; and
    transmitting the compiled circuit design to the emulator system.

15. The method of claim 13 wherein the compiled circuit design is generated using a computer program running on the host computer.

16. The method of claim 13 wherein the data of one or more dynamic netlists representative of the trigger circuit is generated using a computer program running on the host computer.

17. The method of claim 13 wherein the data of the one or more dynamic netlists is used to form a programmable trigger circuit, the trigger circuit being a state machine comprising a random access memory and an N-bit register.

18. The method of claim 17, wherein the programmable trigger circuit comprises one or more dynamic netlists and selects a dynamic netlist from the one or more of the dynamic netlists using the present state of the state machine.

19. The method of claim 17, wherein the random access memory includes a look-up table.

20. A method for dynamically programming a trigger condition into an emulator system having emulation resources for emulating a circuit design, the method comprising:

loading a compiled circuit design into a first portion of the emulation resources of the emulator system from a host computer;

loading data of one or more dynamic netlists representative of a trigger circuit into a second portion of emulation resources of the emulator system from the host computer;

programming the data of the one or more dynamic netlists representative of the trigger circuit into the second portion of emulation resources of the emulator system; and reconstructing a signal value within the compiled circuit design that was eliminated when the compiled circuit design was being compiled using the one or more dynamic netlists.

21. A computer-readable storage medium comprising computer executable instructions which when executed on a computer perform a method for dynamically programming a trigger condition into an emulator system having emulation resources for emulating a circuit design, the medium comprising instructions for:

loading a compiled circuit design into a first portion of the emulation resources of the emulator system from a host computer;

receiving input data defining a trigger definition from a user;

generating data of one or more dynamic netlists representative of the trigger definition in the host computer;

loading data of the one or more dynamic netlists representative of the trigger definition into a second portion of emulation resources of the emulator system from the host computer, to generate trigger signal;

programming the data of the one or more dynamic netlists representative of the trigger circuit into the second portion of emulation resources of the emulator system without having to recompile the circuit design, thereby creating a new programmable trigger circuit, the programmable trigger circuit being a state machine comprising a random access memory and an N-bit register; and evaluating a Boolean expression specified by the user as part of the trigger definition using the one or more dynamic netlists.

22. The computer-readable storage medium of claim 21 further comprising computer instructions for transmitting the dynamic netlist to the emulator system.

23. The computer-readable storage medium of claim 21 further comprising computer instructions for observing trace data captured by the emulator system after the trigger signal has been generated.

24. The computer-readable storage medium of claim 21, wherein the programmable trigger circuit selects a dynamic netlist from the one or more dynamic netlists using the present state of the state machine.

25. The computer-readable storage medium of claim 21, wherein the random access memory includes a look-up table.

* * * * *